US009287295B2

(12) United States Patent
Lee et al.

(10) Patent No.: US 9,287,295 B2
(45) Date of Patent: Mar. 15, 2016

(54) DISPLAY APPARATUS AND METHOD OF DETECTING SHORT-CIRCUIT FAILURE OF THE DISPLAY APPARATUS

(71) Applicant: Samsung Display Co., Ltd., Gyeonggi-Do (KR)

(72) Inventors: June-Woo Lee, Gyeonggi-Do (KR); Jae-Beom Choi, Gyeonggi-Do (KR); Kwan-Wook Jung, Gyeonggi-Do (KR); Sung-Soo Choi, Gyeonggi-Do (KR); Seong-Jun Kim, Gyeonggi-Do (KR); Guang-Hai Jin, Gyeonggi-Do (KR); Ga-Young Kim, Gyeonggi-Do (KR); Jee-Hoon Kim, Gyeonggi-Do (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 545 days.

(21) Appl. No.: 13/665,392

(22) Filed: Oct. 31, 2012

(65) Prior Publication Data
US 2013/0307548 A1 Nov. 21, 2013

(30) Foreign Application Priority Data
May 16, 2012 (KR) .......................... 10-2012-0052208

(51) Int. Cl.
*H01L 27/12* (2006.01)
*G01R 31/02* (2006.01)
*H01L 27/32* (2006.01)

(52) U.S. Cl.
CPC ............ *H01L 27/124* (2013.01); *G01R 31/025* (2013.01); *H01L 27/3276* (2013.01); *H01L 2251/568* (2013.01)

(58) Field of Classification Search
None
See application file for complete search history.

(56) References Cited

U.S. PATENT DOCUMENTS

| 6,791,522 | B2 | 9/2004 | Yi et al. | |
|---|---|---|---|---|
| 7,429,970 | B2 * | 9/2008 | Tsai et al. | 345/87 |
| 2004/0135164 | A1 * | 7/2004 | Park et al. | 257/99 |
| 2007/0126671 | A1 * | 6/2007 | Naoaki | 345/77 |
| 2007/0132365 | A1 * | 6/2007 | Kang et al. | 313/500 |
| 2007/0229413 | A1 * | 10/2007 | Hara | 345/76 |
| 2008/0204384 | A1 * | 8/2008 | Lee et al. | 345/83 |
| 2008/0265250 | A1 * | 10/2008 | Huang et al. | 257/48 |

FOREIGN PATENT DOCUMENTS

| JP | 11-251438 A | 9/1999 |
|---|---|---|
| KR | 10-2002-0041844 A | 6/2002 |
| KR | 10-2002-0075628 A | 10/2002 |
| KR | 10-2004-0022634 A | 3/2004 |

\* cited by examiner

*Primary Examiner* — Melissa Koval
*Assistant Examiner* — Courtney McDonnough
(74) *Attorney, Agent, or Firm* — Knobbe, Martens, Olson & Bear, LLP (57) ABSTRACT

A display apparatus is disclosed. The apparatus includes a plurality of unit pixels each comprising a plurality of sub pixels, a plurality of scan wires, and a plurality of scan lines branching off from each of the scan wires and extending in a first direction. The number of scan lines from each scan wire equals the number of sub pixels for each pixel, and each scan line connects one of the scan wires with one of the sub pixels of each of a plurality of unit pixels. The apparatus also includes a plurality of data lines extending in a second direction orthogonal to the first direction and which are connected to the plurality of sub pixels. The apparatus also includes a first power supply line extending in the second direction and connected to the sub pixels, and a plurality of test pads, each connected to the scan lines of one of the scan wires.

18 Claims, 6 Drawing Sheets

DISPLAY APPARATUS AND METHOD OF DETECTING SHORT-CIRCUIT FAILURE OF THE DISPLAY APPARATUS

CROSS-REFERENCE TO RELATED APPLICATIONS

This application claims the benefit of Korean Patent Application No. 10-2012-0052208, filed on May 16, 2012, in the Korean Intellectual Property Office, the disclosure of which is incorporated herein in its entirety by reference.

BACKGROUND

1. Field

The disclosed technology relates to a display apparatus and a method of detecting a short-circuit failure of the display apparatus.

2. Description of the Related Technology

An organic light-emitting diode (OLED) display apparatus includes thin film transistors (TFTs) and organic electroluminescent devices (hereinafter referred to as organic EL devices) respectively driven by the TFTs and forming an image. That is, if an electric current is supplied to the organic EL devices through the TFTs, the organic EL devices emit light and form an image.

The OLED display apparatus includes a plurality of layers including various wires connected to the TFTs. Of these wires, a power voltage supply line generally referred to as an ELVDD wire has a very large width compared to the other wires.

However, a wire having a very large width increases the area where the wire overlaps other wires in other layers. An increased overlap increases a possibility of a short-circuit failure between wires. Thus, a method of detecting a short-circuit failure with respect to the power voltage supply line is needed.

SUMMARY OF CERTAIN INVENTIVE ASPECTS

One aspect is a display apparatus. The apparatus includes a plurality of unit pixels each comprising a plurality of sub pixels, a plurality of scan wires, and a plurality of scan lines branching off from each of the scan wires and extending in a first direction. The number of scan lines from each scan wire equals the number of sub pixels for each pixel, and each scan line connects one of the scan wires with one of the sub pixels of each of a plurality of unit pixels. The apparatus also includes a plurality of data lines extending in a second direction orthogonal to the first direction and which are connected to the plurality of sub pixels. The apparatus also includes a first power supply line extending in the second direction and connected to the sub pixels, and a plurality of test pads, each connected to the scan lines of one of the scan wires.

Another aspect includes an organic light-emitting diode (OLED) display apparatus. The apparatus includes a plurality of unit pixels each comprising a plurality of sub pixels, wherein each sub pixel comprises a first electrode, a second electrode, and an organic electroluminescent layer between the first electrode and the second electrode. The apparatus also includes a plurality of scan wires, and a plurality of scan lines branching off from each of the scan wires and extending in a first direction. The number of scan lines from each scan wire equals the number of sub pixels for each pixel, and each scan line connects one of the scan wires with one of the sub pixels of each of a plurality of unit pixels. The apparatus also includes a plurality of data lines extending in a second direction orthogonal to the first direction and connected to the plurality of sub pixels, a first power supply line extending in the second direction and connected to the sub pixels, a plurality of second power supply lines extending in the first direction and connected to the first power supply line, and a plurality of test pads, each connected to the scan lines of one of the scan wires. The scan lines, the data lines, the first power supply line, and the second power supply lines do not overlap the first electrode.

Another aspect includes a method of detecting a short-circuit failure of a display apparatus comprising a plurality of unit pixels each comprising a plurality of sub pixels, a plurality of scan wires, and a plurality of scan lines branching off from each of the scan wires and extending in a first direction. The number of scan lines from each scan wire equals the number of sub pixels for each pixel, and each scan line connects one of the scan wires with one of the sub pixels of each of a plurality of unit pixels. The apparatus also includes a plurality of data lines extending in a second direction orthogonal to the first direction and connected to the plurality of sub pixels, a first power supply line extending in the second direction and connected to the sub pixels, and a plurality of test pads, each connected to the scan lines of one of the scan wires. The method includes detecting a waveform for each of the scan lines of one of the scan wires by scanning the test pad connected to the scan lines of the one scan wire, and detecting a defective scan line by comparing the detected waveforms with one or more previously determined defective waveforms.

DETAILED DESCRIPTION OF CERTAIN INVENTIVE EMBODIMENTS

Hereinafter, exemplary embodiments are described more fully with reference to the accompanying drawings. As used herein, expressions such as "at least one of," when preceding a list of elements, modify the entire list of elements and do not modify the individual elements of the list.

Figure 1:
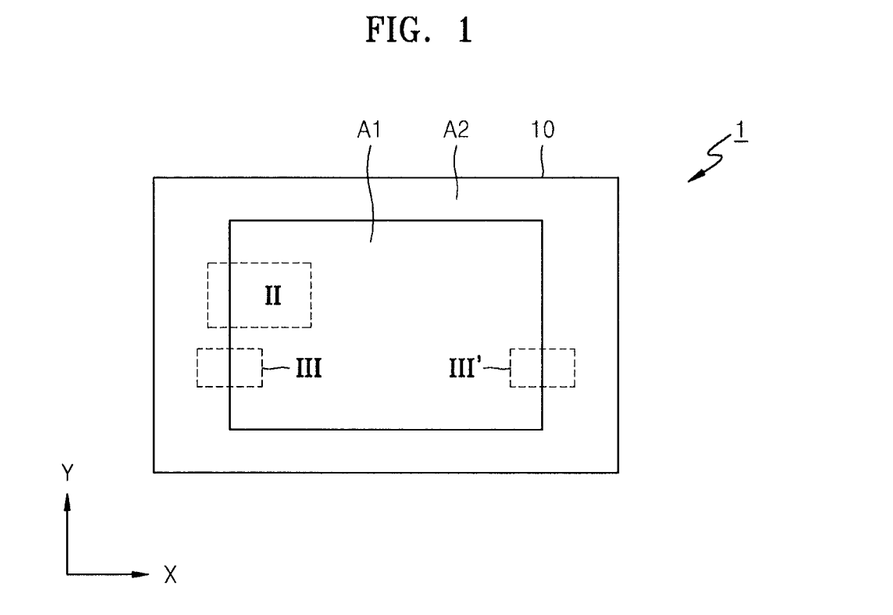
FIG. 1 is a schematic plan view of an organic light-emitting diode (OLED) display apparatus according to an embodiment.
Figure 2:
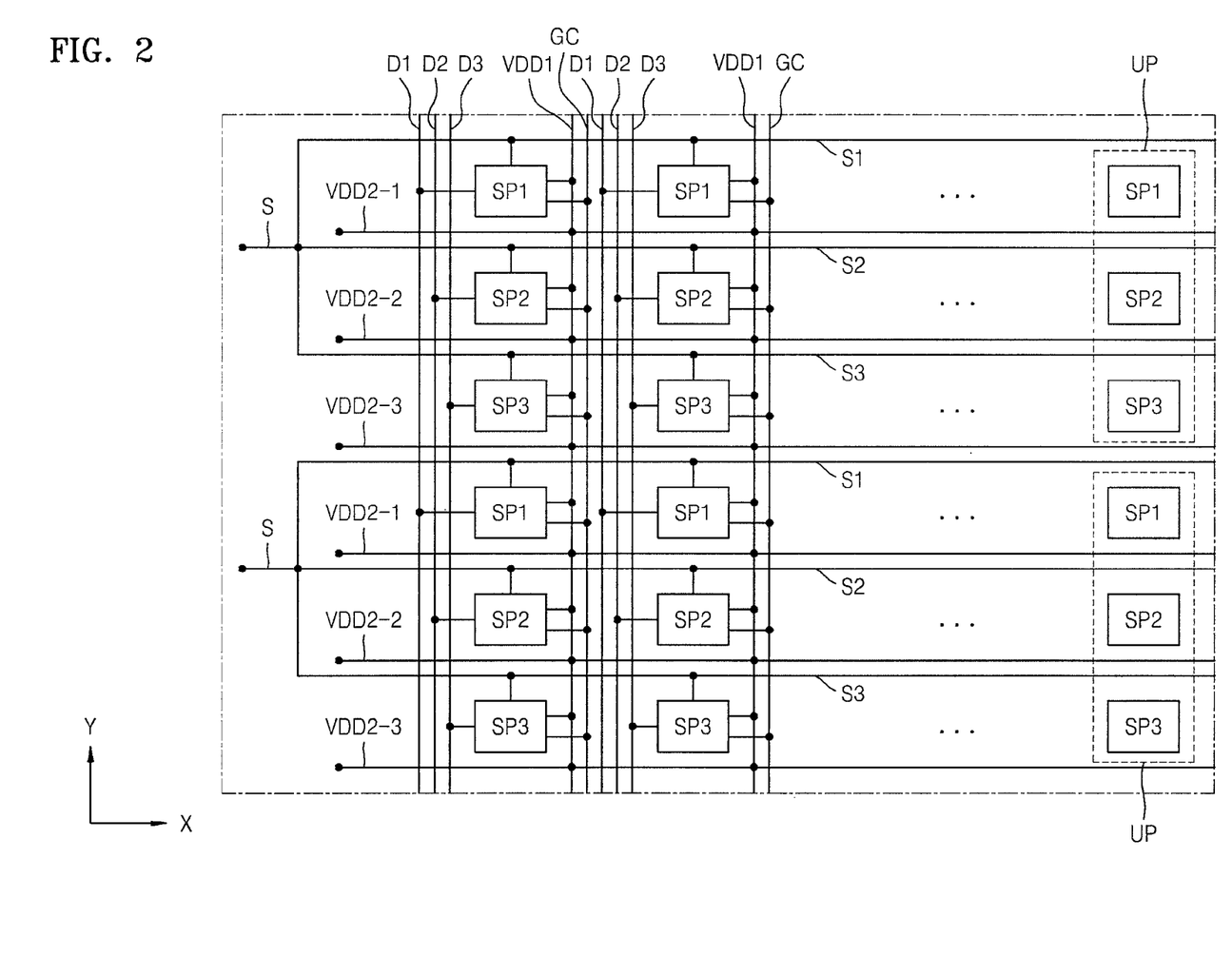
FIG. 2 is a schematic cross-sectional view of wires in a region II of FIG. 1.

FIG. 1 is a schematic plan view of an organic light-emitting diode (OLED) display apparatus 1 according to an embodiment. FIG. 2 is a schematic cross-sectional view of wires in a region II of FIG. 1.

Referring to FIG. 1, the OLED display apparatus 1 of the present embodiment defines a display area A1 and a non-display. area A2 in a substrate 10. Referring to FIG. 2, the display area A1 includes a plurality of unit pixels UPs in which an image is formed.

Each unit pixel UP includes a plurality of sub pixels SP1, SP2, and SP3 that emit different colors in a second direction Y. For example, each unit pixel UP may include a sub pixel that emits red, a sub pixel that emits green, and a sub pixel that emits blue. Although the three sub pixels SP1, SP2, and SP3 form the unit pixel UP in the present embodiment, the present invention is not limited thereto. That is, the number of sub pixels of a unit pixel may increase or decrease.

The sub pixels SP1 that emit the same color are disposed in a first direction X of the display area A1. The sub pixels SP1, SP2, and SP3 that emit different colors are repeatedly disposed in the second direction Y orthogonal to the first direction X. The sub pixels SP1, SP2, and SP3 form one unit pixel UP.

The first through third scan lines S1, S2, and S3 that branch off from one scan wire S and extend in the first direction X are arranged in each unit pixel UP. The first scan lines S1 are connected to the sub pixels SP1, respectively, that emit a first color of neighboring unit pixels UP. The second scan lines S2 are connected to the sub pixels SP2, respectively, that emit a second color of neighboring unit pixels UP. The third scan lines S3 are connected to the sub pixels SP3, respectively, that emit a third color of neighboring unit pixels UP. Although the sub pixels SP1, SP2, and SP3 of one unit pixel UP are respectively connected to the first through third scan lines S1, S2, and S3, since the first through third scan lines S1, S2, and S3 branch off from the scan wire S, the same scan signal is input to each of the sub pixels SP1, SP2, and SP3 included in each unit pixel UP.

Meanwhile, a test pad TP (see FIG. 3) is disposed between the one scan wire S before being branched off and the first through third scan lines S1, S2, and S3 that branch off in each unit pixel UP and is connected to the first through third scan lines S1, S2, and S3. This is described in detail below.

First through third data lines D1, D2, and D3 that are independently and respectively connected to the sub pixels SP1, SP2, and SP3 that emit different colors and extend in the second direction Y are disposed in each unit pixel UP. That is, the first data line D1 is connected to the sub pixel SP1 that emits a first color, the second data line D2 is connected to the sub pixel SP2 that emits a second color, and the third data line D3 is connected to the sub pixel SP3 that emits a third color. Thus, different data signals may be input to the sub pixels SP1, SP2, and SP3 of each unit pixel UP.

In the present embodiment, lengths of the first through third data lines D1, D2, and D3 are shorter that those of the first through third scan lines S1, S2, and S3. If the lengths of the first through third data lines D1, D2, and D3 increase, intensities of data signals input to the sub pixels SP1, SP2, and SP3 deteriorate due to wire resistances that vary according to the lengths. An OLED display apparatus is generally more sensitive to a data signal than a scan signal. Thus, in the present embodiment, non-uniformity of data signals input to the OLED display apparatus 1 may be reduced or prevented.

A first power supply line VDD1 for supplying power is connected to the sub pixels SP1, SP2, and SP3 of the display area A1 in the second direction Y. Since the first power supply line VDD1 is disposed in the second direction Y in the present embodiment, a length of the first power supply line VDD1 is shorter than those of the first through third scan lines S1, S2, and S3. A voltage drop may occur in the first power supply line VDD1 due to resistance with respect to the length thereof.

To solve the voltage drop of the first power supply line VDD1, additional power supply lines may be further connected to the sub pixels SP1, SP2, and SP3. In the present embodiment, each of the sub pixels SP1, SP2, and SP3 included in one unit pixel UP includes second power supply lines VDD2-1, VDD2-2, and VDD2-3 that are connected to the first power supply line VDD1 in the first direction X. The second power supply lines VDD2-1, VDD2-2, and VDD2-3 may be continuously disposed between the first through third scan lines S1, S2, and S3 respectively connected to the sub pixels SP1, SP2, and SP3 of one unit pixel UP. In the present embodiment, the second power supply lines VDD2-1, VDD2-2, and VDD2-3 are connected to all the sub pixels SP1, SP2, and SP3 of one unit pixel UP. However, the present invention is not limited thereto.

The first power supply line VDD1 may be wider than the first through third scan lines S1, S2, and S3 or the first through third data lines D1, D2, and D3. Thus, a wire having a large width results in an increase of an area in which the wire having a large width and a wire disposed on another layer overlap, which also increases a possibility of a short-circuit failure between wires. In the present embodiment, since the first power supply line VDD1 overlaps and crosses the first through third scan lines S1, S2, and S3, when a short-circuit failure occurs between the first power supply line VDD1 and any of the first through third scan lines S1, S2, and S3, the first through third scan lines S1, S2, and S3 in which the short-circuit failure occurs need to be detected to repair the short-circuit failure of the first through third scan lines S1, S2, and S3. However, in a case where the scan wire S branches off for each of the first through third scan lines S1, S2, and S3 in the unit pixel UP like in the present embodiment, it is not easy to detect the sub pixels SP1, SP2, and SP3 connected to the first through third scan lines S1, S2, and S3 in which the short-circuit failure occurs. This will be described in detail later.

Figure 8:
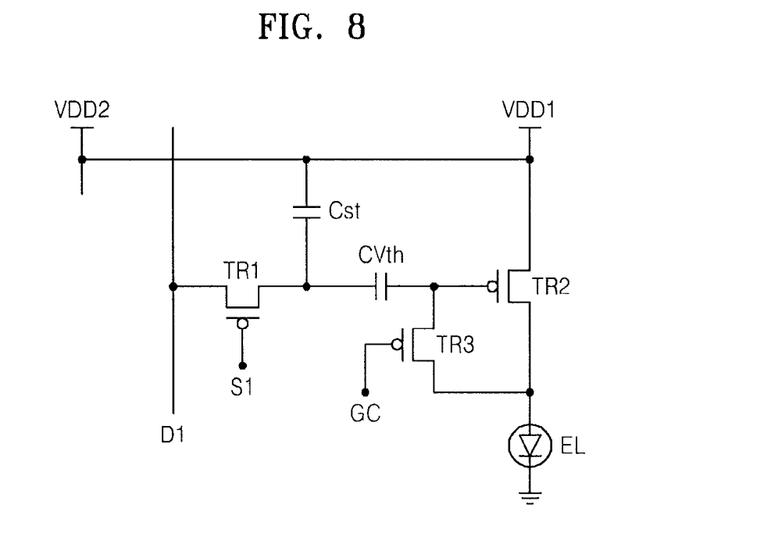
FIG. 8 is a circuit diagram of a wire configuration of a sub pixel of the OLED display apparatus, according to an embodiment.

Meanwhile, the OLED display apparatus 1 of the present embodiment may further include a compensation control signal line GC for compensating for a threshold voltage of a third TFT TR3 (see FIG. 8). The compensation control signal line GC may be connected to the sub pixels SP1, SP2, and SP3 in the second direction Y.

Figure 3:
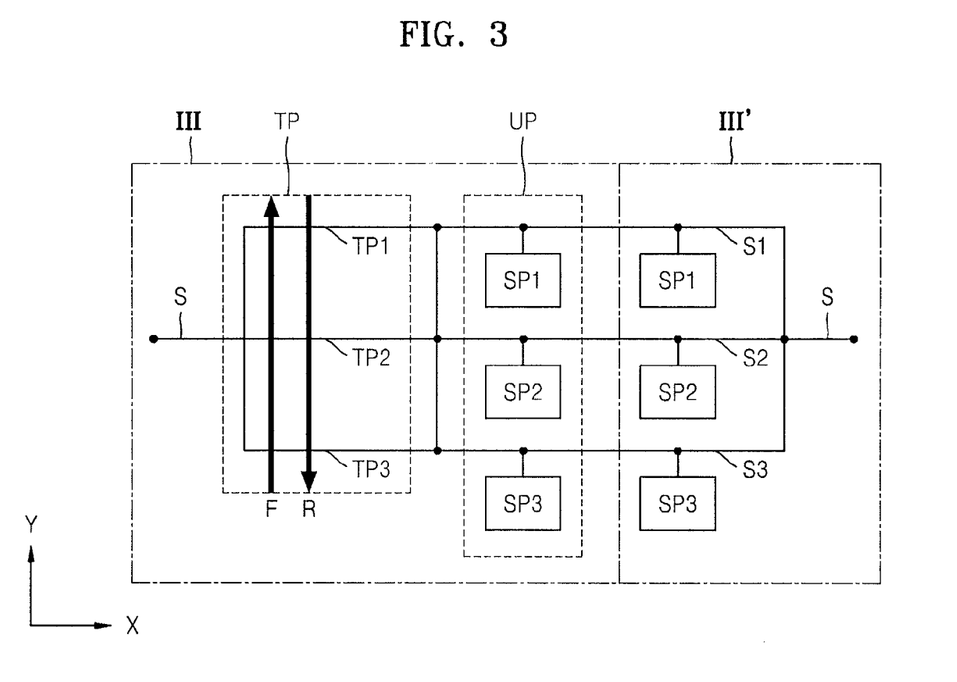
FIG. 3 is a schematic cross-sectional view a scan line and a test pad in regions III and III' of FIG. 1.

FIG. 3 is a schematic cross-sectional view of the scan line S and the test pad TP in regions III and III' of FIG. 1. Referring to FIG. 3, the scan wire S before being branched off into the sub pixels SP1, SP2, and SP3 is disposed in a boundary of the display area A1.

The test pad TP is disposed between the one scan wire S before being branched off and the first through third scan lines S1, S2, and S3 that branch off in each unit pixel UP and is connected to the first through third scan lines S1, S2, and S3. More specifically, the test pad TP includes a first test pad TP1 connected to the first scan line S1, a second test pad TP2 connected to the second scan line S2, and a third test pad TP3 connected to the third scan line S3.

In the present invention, to detect a short-circuit failure of the first through third scan lines S1, S2, and S3, the first through third scan lines S1, S2, and S3 in which a short-circuit failure occurs may be determined by comparing defective waveforms detected in the first through third test pads TP1, TP2, and TP3 with a previously determined defective waveform for each of the first through third scan lines S1, S2, and S3. For example, a detector (not shown) may determine the first through third scan lines S1, S2, and S3 in which the short-circuit failure occurs by scanning the test pad TP connected to the first through third scan lines S1, S2, and S3 in which the short-circuit failure occurs in a forward direction F or in a reverse direction R, detecting a waveform, and comparing the detected waveform with the previously determined defective waveform for each of the first through third scan lines S1, S2, and S3. In this regard, the forward direction F may be the second direction Y, and the reverse direction R may be a direction −Y opposite to the second direction Y.

Figure 4:
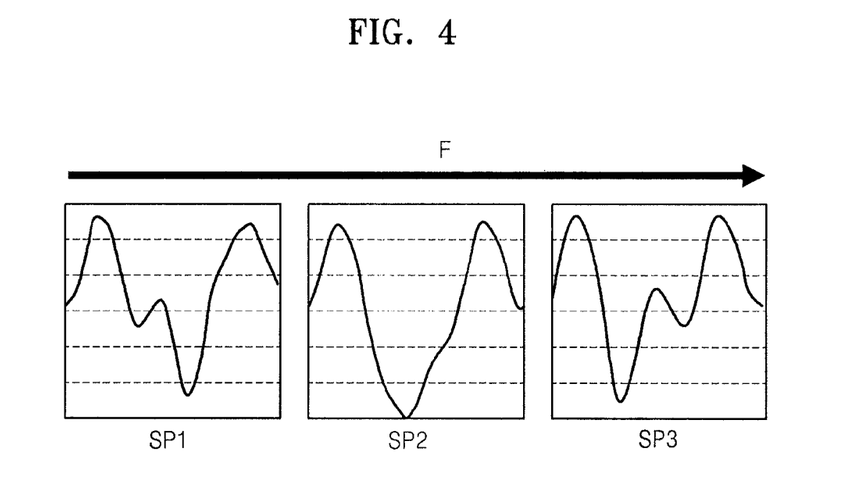
FIG. 4 illustrates previously determined defective waveforms of scan lines connected to sub pixels when a test pad is scanned in a forward (F) direction.
Figure 5:
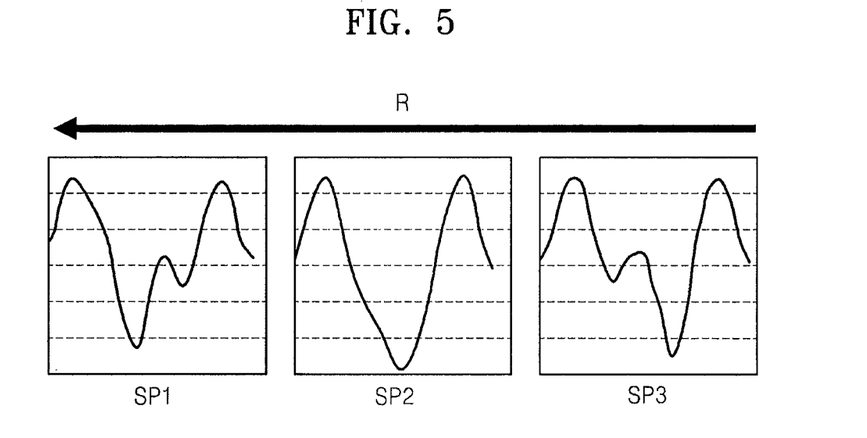
FIG. 5 illustrates previously determined defective waveforms of scan lines connected to sub pixels when a test pad is scanned in a reverse (R) direction.

FIG. 4 illustrates previously determined defective waveforms of scan lines connected to the sub pixels SP1, SP2, and SP3 when the test pad TP is scanned in the forward direction F. FIG. 5 illustrates previously determined defective waveforms of scan lines connected to the sub pixels SP1, SP2, and SP3 when the test pad TP is scanned in the reverse direction R.

Referring to FIGS. 4 and 5, it is apparent that the previously determined defective waveforms of the scan lines corresponding to the respective sub pixels SP1, SP2, and SP3 are different from each other, and the previously determined defective waveforms detected in the forward direction F and the previously determined defective waveforms detected in the reverse direction R are opposite to each other. Furthermore, it is apparent that the previously determined defective waveforms of the scan lines connected to the sub pixels SP1 and SP3 disposed at both ends among the sub pixels SP1, SP2, and SP3 are opposite to each other.

Figure 6A:
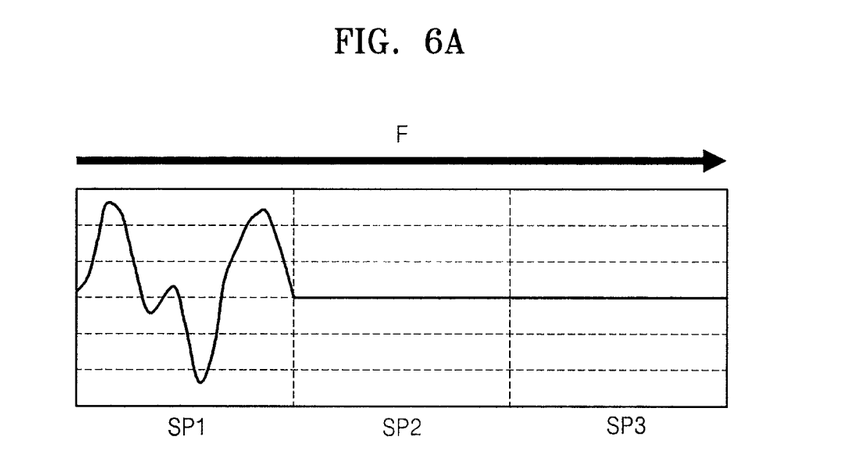
FIG. 6A illustrates waveforms detected when a test pad is scanned in a forward (F) direction in a case where a short-circuit failure occurs only in a first scan line connected to a first sub pixel.

FIG. 6A illustrates waveforms detected when the test pad TP is scanned in the forward direction F in a case where a short-circuit failure occurs only in the first scan line S1 connected to the first sub pixel SP1.

Upon comparing FIGS. 4 and 6A, an operator may know that the short-circuit failure occurs only in the first scan line S1 connected to the first sub pixel SP1. A location of a defective scan line is determined in the first direction X, and thus the operator finds a defective location in the second direction Y as a next step.

The defective location in the second direction Y may use a voltage difference between both ends of the first power supply line VDD1 extending in the second direction Y. The operator may find the exact defective location to repair a defective wire part.

Figure 6B:
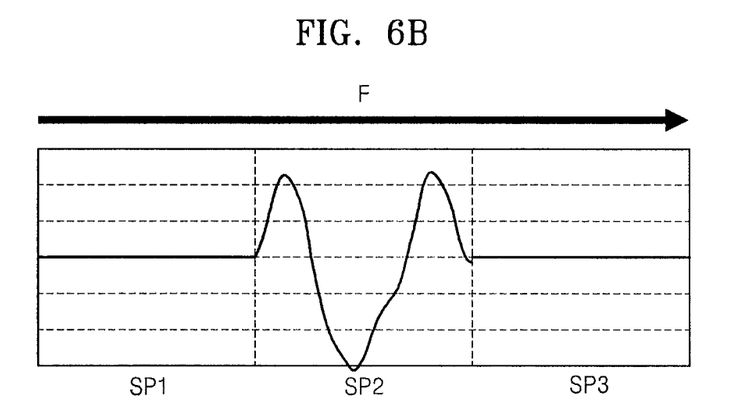
FIG. 6B illustrates waveforms detected when a test pad is scanned in a forward (F) direction in a case where a short-circuit failure occurs only in a second scan line connected to a second sub pixel.

FIG. 6B illustrates waveforms detected when the test pad TP is scanned in the forward direction F in a case where a short-circuit failure occurs only in the second scan line S2 connected to the second sub pixel SP2. Upon comparing FIGS. 4 and 6B, an operator may know that the short-circuit failure occurs only in the second scan line S2 connected to the second sub pixel SP2.

Figure 6C:
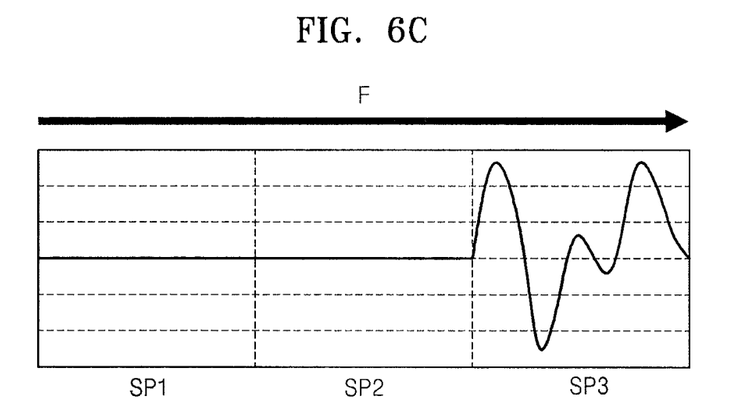
FIG. 6C illustrates waveforms detected when a test pad is scanned in a forward (F) direction in a case where a short-circuit failure occurs only in a third scan line connected to a third sub pixel.

FIG. 6C illustrates waveforms detected when the test pad TP is scanned in the forward direction F in a case where a short-circuit failure occurs only in the third scan line S3 connected to the third sub pixel SP3. Upon comparing FIGS. 4 and 6C, an operator may know that the short-circuit failure occurs only in the third scan line S3 connected to the third sub pixel SP3.

Figure 7:
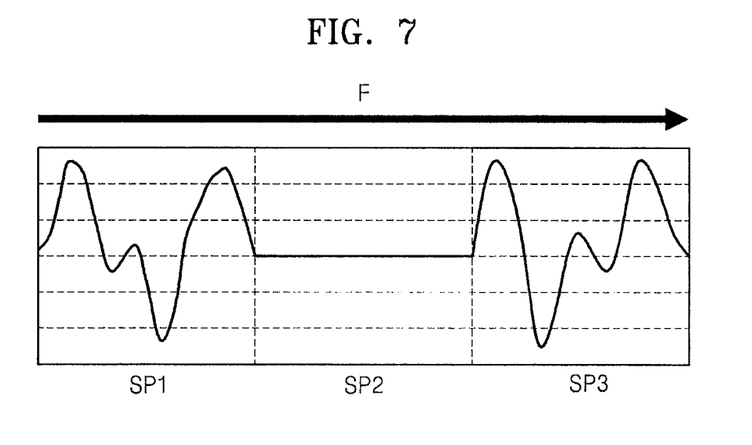
FIG. 7 illustrates waveforms detected when a test pad is scanned in a forward (F) direction in a case where a short-circuit failure occurs only in first and third scan lines connected to first and third sub pixels.

FIG. 7 illustrates waveforms detected when the test pad TP is scanned in the forward direction F in a case where a short-circuit failure occurs only in the first and third scan lines S1 and S3 connected to the first and third sub pixels SP1 and SP3. Upon comparing FIGS. 4 and 7, an operator may know that the short-circuit failure occurs only in the first and third scan lines S1 and S3 connected to the first and third sub pixels SP1 and SP3.

FIGS. 6A through 7 illustrate some examples of the short-circuit failure defects, and the present invention is not limited thereto. Therefore, one of ordinary skill in the art may know a scan line in which the short-circuit failure occurs, other than the above examples, by comparing the defective waveforms detected in the test pad TP with a previously determined defective waveform.

FIG. 8 is a circuit diagram of a wire configuration of a sub pixel of the OLED display apparatus 1, according to an embodiment of the present invention. Referring to FIG. 8, the sub pixel includes a first TFT TR1 that is a switching TFT, a second TFT TR2 that is a driving TFT, the third TFT TR3 that is a compensation signal TFT, capacitors Cst and Cvth that are storage elements, and an organic electroluminescent device (hereinafter referred to as an organic EL device) EL driven by the first through third TFTs TR1, TR2, and TR3. In this regard, the number of first through third TFTs TR1, TR2, and TR3 and the number of capacitors Cst and Cvth are not limited to those shown in FIG. 3. That is, the present invention may be applied to an OLED display including at least two TFTs and at least one capacitor.

FIG. 8 illustrates the sub pixel SP1 that emits a first color among the sub pixels SP1, SP2, and SP3 of FIG. 2. That is, the first TFT TR1 is switched by a scan signal that is applied from the first scan line S1, and the first TFT TR1 transfers a data signal that is applied from the first data line D1 to the capacitors Cst and Cvth and the second TFT TR2. The second TFT TR2 determines an amount of current input into the organic EL device through the first power supply line VDD1 and the second power supply line VDD2 using the data signal transferred by the first TFT TR1 and the second TFT TR2 supplies the current to the organic EL device. The third TFT TR3 is connected to a compensation control signal line GC and compensates for a threshold voltage.

In the present embodiment, since the second power supply line VDD2 is electrically connected to the first power supply line VDD1, although the first power supply line VDD1 is short-circuited, the second power supply line VDD2 may function as a bypass line to drive the organic EL device.

Figure 9:
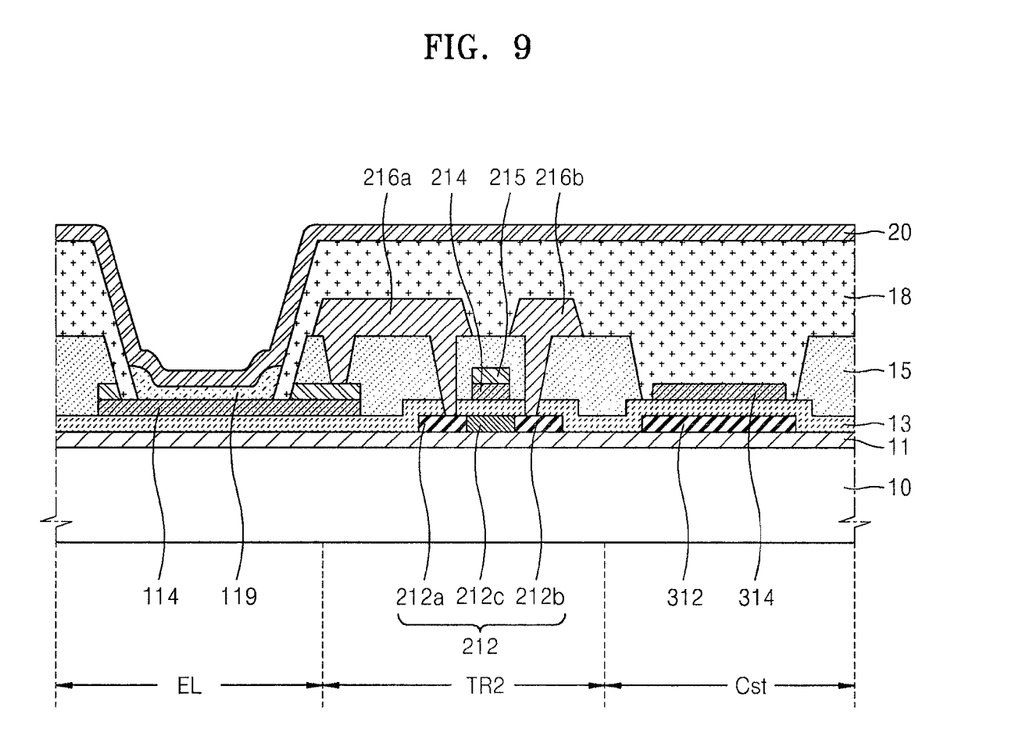
FIG. 9 is a schematic cross-sectional view of some elements of a sub pixel of the OLED display apparatus, according to an embodiment.

FIG. 9 is a schematic cross-sectional view of some elements of a sub pixel of the OLED display apparatus 1, according to an embodiment of the present invention. Referring to FIG. 9, the second TFT TR2 that is a driving TFT, the storage capacitor Cst, and the organic EL device are disposed on the substrate 10. As described above, the sub pixel further includes the first TFT TR1, the third TFT TR3, and the compensation capacitor Cvth, and includes various wires but some elements thereof are briefly described with reference to FIG. 9.

The substrate 10 may be formed of a transparent material such as glass having $SiO_2$ as a main component. However, the substrate 10 is not limited thereto and may be formed of a transparent plastic material.

A buffer layer 11 may be further formed on the substrate 10. The buffer layer 11 provides a planar surface to a top portion of the substrate 10 and prevents moisture and impurities from penetrating into the substrate 10.

An active layer 212 of the second TFT TR2 is partially formed on the buffer layer 11. The active layer 212 may be formed of an inorganic semiconductor such as amorphous silicon or polysilicon. The active layer 212 may be formed of various materials such as an organic semiconductor or an oxide semiconductor. The active layer 212 includes a source region 212b, a drain region 212a, and a channel region 212c.

A gate electrode first layer 214 and a gate electrode second layer 215, including transparent conductive materials, are sequentially disposed on the active layer 212 at a position corresponding to the channel region 212c of the active layer 212, and a first insulation layer 13 that is a gate insulation film is disposed between the active layer 212 and the gate electrode first and second layers 214 and 215.

A source electrode 216b and a drain electrode 216a respectively connected to the source region 212b and the drain region 212a of the active layer 212 are disposed on the gate electrode second layer 215, and a second insulation layer 15 that is an interlayer insulation film is disposed between the source electrode 216b and the drain electrode 216a.

A third insulation layer 18 is disposed on the second insulation layer 15 to cover the source electrode 216b and the drain electrode 216a. The third insulation layer 18 may be an organic insulation film.

A pixel electrode first layer 114, formed of the same transparent conductive material as the gate electrode first layer 214, is partially formed on the buffer layer 11 and the first insulation layer 13. The transparent conductive material may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

An emissive layer 119 is partially formed on the pixel electrode first layer 114. Light emitted from the emissive layer 119 is emitted toward the substrate 10 through the pixel electrode first layer 114 formed of the transparent conductive material.

The emissive layer 119 may be formed of low molecular weight organic materials or polymer organic materials. If the emissive layer 119 is formed of low molecular weight organic materials, a hole transport layer (HTL), a hole injection layer (HIL), an electron transport layer (ETL), and an electron injection layer (EIL) may be stacked with respect to the emissive layer 119. Other various layers may be stacked according to necessity. In this regard, available organic materials include copper phthalocyanine (CuPc), N,N'-Di(naphthalene-1-yl)-N, N'-diphenyl-benzidine (NPB), tris-8-hydroxyquinoline aluminum (Alq3), etc.

Otherwise, if the emissive layer 119 is formed of polymer organic materials, the emissive layer 119 may include a HTL. The HTL may use poly-(2,4)-ethylene-dihydroxy thiophene (PEDOT) or polyaniline (PANI). In this regard, available organic materials include polymer organic materials such as polyphenylene vinylene (PPV) and polyfluorene.

An opposing electrode 20 is stacked on the emissive layer 119 as a common electrode. In the OLED display apparatus 1 of the present embodiment, the pixel electrode first layer 114 is used as an anode, and the opposing electrode 20 is used as a cathode. The polarities of the electrodes may also be switched around.

The opposing electrode 20 may be a reflective electrode including a reflective material. In this regard, the opposing electrode 20 may include at least one material selected from the group consisting of Al, Mg, Li, Ca, LiF/Ca, and LiF/Al.

Since the opposing electrode 20 serves as the reflective electrode, light emitted from the emissive layer 119 is reflected from the opposing electrode 20, transmitted through the pixel electrode first layer 114 formed of the transparent conductive material, and emitted toward the substrate 10.

Since the OLED display apparatus 1 of the present embodiment is a bottom emission type display apparatus in which light is emitted toward the substrate 10, the pixel electrode first layer 114 may not preferably overlap with the first through third scan lines S1, S2, and S3, the first through third data lines D1, D2, and D3, the first power supply line VDD1, and the second power supply lines VDD2-1, VDD2-2, and VDD2-3 (see FIG. 2).

A lower electrode 312 of the capacitor Cst, formed of the same material as the active layer 212 of the second TFT TR2, and an upper electrode 314, including a transparent conductive material that is the same material as the pixel electrode first layer 114, are disposed on the substrate 10 and the buffer layer 11. The first insulation layer 13 is disposed between the lower electrode 312 and the upper electrode 314.

The first insulation layer 13 is disposed on a top portion of the lower electrode 312 but is not disposed in a boundary of the upper electrode 314. The second insulation layer 15 is disposed on a top portion of the first insulation layer 13 and entirely exposes the upper electrode 314 so that the upper electrode 314 entirely contacts the third insulation layer 18.

Although not shown, a sealing member (not shown) may be disposed on a top portion of the opposing electrode 20 in such a way that the sealing member faces one surface of the substrate 10. The sealing member (not shown) is formed to protect the emissive layer 119 from external moisture or oxygen, and may be formed of glass or plastic, or may have a structure in which organic materials and inorganic materials overlap with each other.

A method as described above in the present embodiment accurately detects a scan line in which a short-circuit failure occurs from a plurality of scan lines included in a unit pixel and repairs only a corresponding defective sub-pixel, thereby reducing the burden of processing and time taken to find and repair the defective sub-pixel.

According to the embodiments of the present invention described above, sub pixels of each unit pixel include scan lines that branch off from one wire, data lines independently connected to the sub pixels, a first power supply line vertically disposed in the scan lines, and second power supply lines vertically connected to the first power supply line, thereby preventing voltage drops of power supply lines.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. A display apparatus comprising:
 a plurality of unit pixels each comprising a plurality of sub pixels;
 a plurality of scan wires;
 a plurality of scan lines branching off from each of the scan wires and extending in a first direction, the number of scan lines from each scan wire equaling the number of sub pixels for each pixel, wherein each scan line connects one of the scan wires with one of the sub pixels of each of a plurality of unit pixels;
 a plurality of data lines extending in a second direction orthogonal to the first direction and connected to the plurality of sub pixels;

a plurality of first power supply lines extending in the second direction and connected to the sub pixels;

a plurality of test pads, each connected to the scan lines of one of the scan wires; and a plurality of second power supply lines extending in the first direction and directly connected to the first power supply line, wherein the unit pixels are arranged in a plurality of rows and wherein the second power supply lines are interleaved with the rows of unit pixels.

2. The display apparatus of claim 1, wherein the sub pixels in each of the plurality of unit pixels emit different colors and are arranged sequentially in the second direction.

3. The display apparatus of claim 2, wherein the data lines are independently connected to the sub pixels in each of the unit pixels.

4. The display apparatus of claim 1, wherein the data lines are shorter than the scan lines.

5. The display apparatus of claim 1, wherein the first power supply line is shorter than the scan lines.

6. An organic light-emitting diode (OLED) display apparatus comprising:

a plurality of unit pixels each comprising a plurality of sub pixels, wherein each sub pixel comprises:
a first electrode,
a second electrode, and
an organic electroluminescent layer between the first electrode and the second electrode;

a plurality of scan wires;

a plurality of scan lines branching off from each of the scan wires and extending in a first direction, the number of scan lines from each scan wire equaling the number of sub pixels for each pixel, wherein each scan line connects one of the scan wires with one of the sub pixels of each of a plurality of unit pixels;

a plurality of data lines extending in a second direction orthogonal to the first direction and connected to the plurality of sub pixels;

a plurality of first power supply lines extending in the second direction and connected to the sub pixels;

a plurality of second power supply lines extending in the first direction and directly connected to the first power supply line, wherein the unit pixels are arranged in a plurality of rows and wherein the second power supply lines are interleaved with the rows of unit pixels; and a plurality of test pads, each connected to the scan lines of one of the scan wires, wherein the scan lines, the data lines, the first power supply line, and the second power supply lines do not overlap the first electrode.

7. The OLED display apparatus of claim 6, wherein the first electrode is a transparent electrode, and the second electrode is a reflective electrode.

8. The OLED display apparatus of claim 6, further comprising a plurality of compensation control signal lines extending in the second direction and connected to the plurality of sub pixels.

9. The OLED display apparatus of claim 6, wherein the plurality of sub pixels included in each of the plurality of unit pixels emit different colors, and are arranged sequentially in the second direction.

10. The OLED display apparatus of claim 6, wherein the data lines are independently connected to the sub pixels in each of the pixels.

11. The OLED display apparatus of claim 6, wherein the data lines are shorter than the scan lines.

12. The OLED display apparatus of claim 6, wherein the first power supply line is shorter than the scan lines.

13. A method of detecting a short-circuit failure of a display apparatus comprising:

a plurality of unit pixels each comprising a plurality of sub pixels;

a plurality of scan wires;

a plurality of scan lines branching off from each of the scan wires and extending in a first direction, the number of scan lines from each scan wire equaling the number of sub pixels for each pixel, wherein each scan line connects one of the scan wires with one of the sub pixels of each of a plurality of unit pixels;

a plurality of data lines extending in a second direction orthogonal to the first direction and connected to the plurality of sub pixels;

a plurality of first power supply lines extending in the second direction and connected to the sub pixels; and a plurality of test pads, each connected to the scan lines of one of the scan wires, wherein the method comprises:
detecting a waveform for each of the scan lines of one of the scan wires by scanning the test pad connected to the scan lines of the one scan wire; and
detecting a defective scan line by comparing the detected waveforms with one or more previously determined defective waveforms.

14. The method of claim 13, wherein the scan lines of the one scan wire each have different previously determined defective waveforms.

15. The method of claim 13, wherein the plurality of unit pixels each comprise three sub pixels that emit different colors and are arranged sequentially in the second direction, and scan lines connected to the sub pixels, which are disposed at both ends of the three sub pixels, have substantially symmetric previously determined defective waveforms.

16. The method of claim 13, wherein the test pad is scanned in a forward direction and in a reverse direction with respect to the second direction to detect the waveforms of the scan lines, and defective waveforms of the scan lines detected in the forward direction and defective waveforms of the scan lines detected in the reverse direction are opposite to each other.

17. The method of claim 13, wherein a location of a defective sub pixel is determined by detecting the defective scan line from the scan in the first direction and then detecting the first power supply line that is short-circuited from the defective scan line from the scan in the second direction.

18. The method of claim 13, further comprising determining the previously determined defective waveform for each of the branching scan lines.

* * * * *